(12) United States Patent
Schlomann

(10) Patent No.: US 7,569,933 B2
(45) Date of Patent: Aug. 4, 2009

(54) HOUSING FOR ACCOMMODATING MICROWAVE DEVICES HAVING AN INSULATING CUP MEMBER

(75) Inventor: Herbert W. Schlomann, Oradell, NJ (US)

(73) Assignee: Electro Ceramic Industries, Hackensack, NJ (US)

( * ) Notice: Subject to any disclaimer, the term of this patent is extended or adjusted under 35 U.S.C. 154(b) by 243 days.

(21) Appl. No.: 11/213,300

(22) Filed: Aug. 26, 2005

(65) Prior Publication Data

US 2007/0235866 A1 Oct. 11, 2007

Related U.S. Application Data

(60) Provisional application No. 60/604,955, filed on Aug. 27, 2004.

(51) Int. Cl.
*H01L 23/02* (2006.01)
(52) U.S. Cl. ........................ 257/728; 257/678
(58) Field of Classification Search ......... 257/678–733; 361/807–812
See application file for complete search history.

(56) References Cited

U.S. PATENT DOCUMENTS

| | | | |
|---|---|---|---|
| 3,320,497 A * | 5/1967 | Neuf ........................ 257/664 |
| 3,676,292 A | 7/1972 | Pryor et al. |
| 3,726,987 A | 4/1973 | Pryor et al. |
| 3,767,979 A | 10/1973 | Reber et al. |
| 4,502,023 A * | 2/1985 | Heitzmann ............... 331/107 R |
| 4,566,027 A * | 1/1986 | Heitzmann et al. .......... 257/702 |
| 4,604,677 A * | 8/1986 | Suzuki et al. ............... 361/729 |
| 4,750,031 A | 6/1988 | Miller et al. |
| 5,041,695 A | 8/1991 | Olenick et al. |
| 5,056,702 A | 10/1991 | Nakahashi et al. |
| 5,102,029 A | 4/1992 | Richardson et al. |
| 5,569,958 A | 10/1996 | Bloom |
| 5,750,926 A | 5/1998 | Schulman et al. |
| 5,994,975 A * | 11/1999 | Allen et al. .................... 333/26 |
| 6,426,511 B1 * | 7/2002 | Nakagawa et al. ............. 257/6 |
| 6,723,379 B2 * | 4/2004 | Stark .......................... 427/180 |
| 2004/0051173 A1 * | 3/2004 | Koh et al. .................... 257/728 |

OTHER PUBLICATIONS

International Search Report dated Oct. 20, 2006 for related PCT Application No. PCT/US05/30425.

* cited by examiner

*Primary Examiner*—Thao P. Le
(74) *Attorney, Agent, or Firm*—Howard IP Law Group, PC

(57) ABSTRACT

A housing for accommodating a microwave device having an insulating cup member.

22 Claims, 4 Drawing Sheets

HOUSING FOR ACCOMMODATING MICROWAVE DEVICES HAVING AN INSULATING CUP MEMBER

RELATED APPLICATION

This application claims priority to U.S. Provisional Application No. 60/604,955, filed Aug. 27, 2004, the subject matter thereof incorporated herein in its entirety.

FIELD OF INVENTION

This invention generally relates to a housing, and more particularly to a housing which accommodates microwave devices and includes a metallic base member and a cup member coupled to the base member.

BACKGROUND OF THE INVENTION

There are numerous microwave (and other high frequency) devices that operate over broad bands of frequencies. These devices find uses in a variety of applications. By way of non-limiting example only, devices such as Gunn devices, avalanche diodes and amplifiers operated over a broad band of frequencies in conjunction with various housings are used in a wide variety of applications to produce different effects.

In addition to these devices, there exist other devices, such as Schottky diodes, which must be mounted in a housing or otherwise securely retained without degrading device performance. It is understood that because of the extremely high and broad operating frequencies, any holding device or housing must present minimum interference with the operation of that device, so the maximum amount of sensitivity can be realized at these frequencies. As these frequencies are extremely high and broad, stray capacitance, inductive and resistive effects can severely impact the operation of such devices.

Other circuits and configurations also require positioning in a housing to provide protection from the environment, and/or to enable coupling to heat sinks and the like. It is the primary objective of any such housing to enable the device to operate efficiently and with a minimum amount of interference from the housing configuration, and to minimize matching and complex impedance effects.

Certain prior art devices, as for example sold by Electro Ceramic Industries, the assignee hereof, utilize a composite symmetrical housing which essentially includes a metal base member with an extending pedestal. Such a device 40 is illustrated in FIGS. 4A and 4B. FIG. 4A shows a top view, and FIG. 4B shows a cross-sectional view taken through line 4B of FIG. 4A. As best shown in FIG. 4B, metal base member 42 has a peripheral flange 43 which interfaces with pedestal 44. Positioned about a peripheral, top portion of metal flange 43 is a ceramic shell or cylinder 41 having an open top and open bottom. The ceramic shell 41 can be metallized, and a cover positioned there over. While this design may operate as a diode case assembly, it does not operate as efficiently as desirable for many high frequency applications.

The packaging designs embodied in the present invention offer a substantial improvement in operation. For example, improvements approaching 70% increased sensitivity, resulting in a much more efficient device, may be expected. It is believed that the improved operation is due to incorporation of a ceramic cup on a metal base member as will be described, as compared to prior art devices, which use a ceramic cylinder on a flange metal base member.

SUMMARY OF INVENTION

A housing for accommodating a microwave device, including: a metallic base member having a lower portion, and having a top and bottom surface, a central pedestal member extending from the top surface, the pedestal member having a device top surface for accommodating the microwave device; an insulator cup member having an open top and a closed bottom surface, and having a pedestal accommodating aperture in the bottom surface, with the cup member being of a greater height than the height of the pedestal member, to cause the cup to completely surround and enclose the pedestal when the pedestal is inserted into the aperture.

BRIEF DESCRIPTION OF THE FIGURES

Understanding of the present invention will be facilitated by considering the following detailed description of the preferred embodiments of the present invention taken in conjunction with the accompanying drawings (which are not to scale), in which like numerals refer to like parts, and.

DETAILED DESCRIPTION OF THE PREFERRED EMBODIMENTS OF THE INVENTION

Figure 1A:
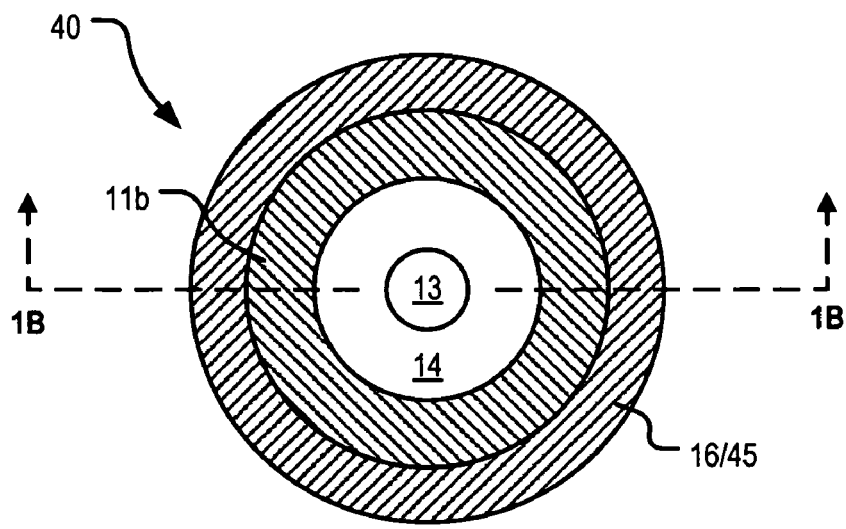
FIG. 1A is a top view of a housing according to an embodiment of the present invention.

It is to be understood that the figures and descriptions of the present invention have been simplified to illustrate elements that are relevant for a clear understanding of the present invention, while eliminating, for the purpose of clarity, many other elements found in typical electronics housings and methods of making and using the same. Those of ordinary skill in the art may recognize that other elements may be desirable and/or required in implementing the present invention. However, because such elements are well known in the art, and because they do not facilitate a better understanding of the present invention, a discussion of such elements is not provided herein.

The present invention finds application in numerous packaging assemblies for microwave devices, such as various microwave diodes, oscillators, and amplifier devices for various purposes including, but not limited to, intrusion detection, door openers, police radar detectors, microwave communications, cellular telephone, RFID readers and other applications where a housing is used to accommodate the device while providing minimum interference to the output of the device. As used herein, the term microwave device encompasses electronic devices and/or package designs operable at or near microwave frequencies, such frequencies being on the order of about 1 Giga Hertz (1 GHz) and upward through the entire microwave frequency band, with such devices including solid state devices and/or vacuum tube-based devices. It is understood that the microwave frequency band may encompass multiple sub-bands of varying bandwidth ranging from about 1 GHz to upward of about 1000 GHz. The electronic devices may be sufficiently broad band in terms of applicability across the frequency band(s) of interest, such that the electronic device(s) may be operated within or over a broad range of frequencies of the microwave region. It is of course understood that the microwave region is not strictly limited to 1 GHz-1000 GHz, but that other high frequencies and/or frequency bands approaching (both lower and higher) this region is also encompassed by the present invention, as is understood by one of ordinary skill in the art.

According to an aspect of the invention, a housing for accommodating a microwave device includes a metallic base secured to a ceramic cup by a ceramic to metal seal. The metallic base has a cylindrical lower portion. A central pedestal extends from the top surface of the metallic base and is surrounded by a ceramic cup. The ceramic cup has an open top surface and a closed bottom surface, with an aperture in the bottom surface through which the pedestal of the base member protrudes. The pedestal is laterally surrounded by the cup member, as the cup member is of a greater height than the pedestal member. The pedestal is sized in such a manner as to improve centering of a device positioned thereupon in the housing itself.

According to another aspect, a symmetrical coaxial housing for accommodating microwave devices comprises a metallic base member having a bottom surface with a peripheral flange, and having a central extending pedestal member. The pedestal member has a cylindrical bottom section which extends into a tapered or conical top section having a top flat surface for accommodating a microwave device. A ceramic cup has a closed bottom with a central aperture to accommodate the pedestal member, whereby when the ceramic cup is placed on the base member, the central aperture of the cup enables the pedestal member to extend into an internal hollow of the cup and be laterally surrounded by the walls of the ceramic member. The top surface of the pedestal member accommodates the microwave device. The open top of the ceramic cup may be suitably coated with a metal, and accommodates a cover member after the microwave device has been placed on the pedestal. The pedestal is sized in such a manner as to facilitate centering of the chip in the housing package.

Figure 1B:
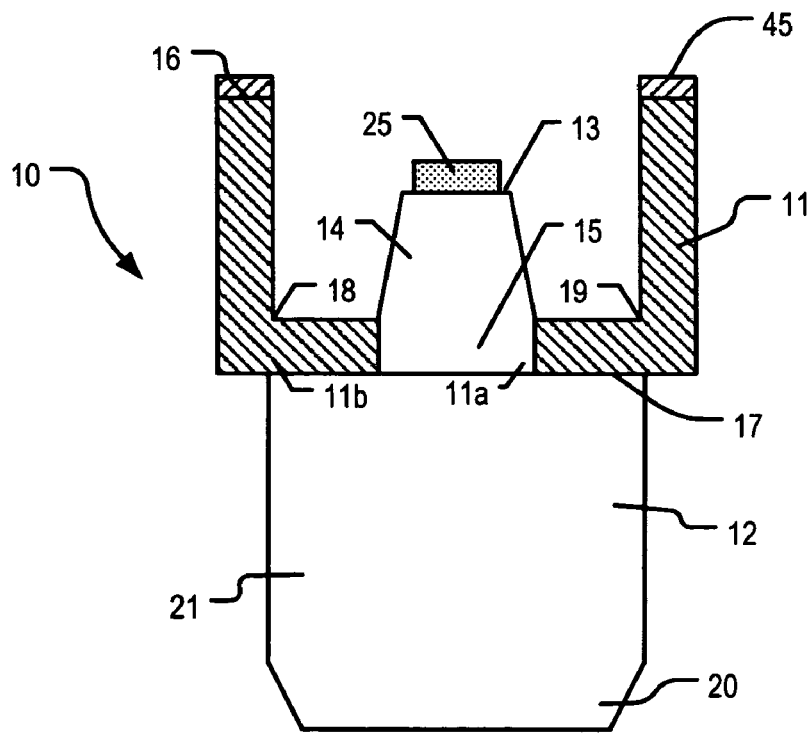
FIG. 1B is a cross-sectional view taken through line 1B-1B of FIG. 1A.

Referring now to FIGS. 1A and 1B, there is shown a coaxial housing 10 for accommodating one or more microwave devices according to an aspect of the present invention. FIG. 1A shows a top view, and FIG. 1B shows a cross-sectional view taken through line 1B of FIG. 1A. As seen in FIG. 1B, housing 10 includes a bottom member 12, which is designated as a base member. Base member 12 may be fabricated from a suitable metal, such as a nickel-cobalt ferrous alloy like Kovar, copper or other conductive metal or other material having a metallic or metallized surface such as a plastic or glass base having a conductive metal coating. As shown, base member 12 includes a bottom portion 20, which is essentially of a trapezoidal shape in cross-section, and which is co-extensive with a central portion 21 having a substantially cylindrical configuration. A tapered center pedestal member 14 extends from base member 12, and includes an at least partially tapered conical member having a bottom portion 15 of a substantially cylindrical configuration extending to a tapered section 14 terminating at top surface 13. Top surface 13 may be used to position a microwave (or other high frequency) device 25 (shown in FIG. 1B) thereon, and to enable the device 25 to be suitably coupled or otherwise connected to receive a biasing voltage.

Housing 10 also includes a ceramic member 11. Ceramic member 11 may be fabricated from various types of ceramic or ceramic-like materials (hereinafter identified as ceramic) understood in the pertinent arts as a high-temperature, insulator material useful in forming substrates for packaging integrated circuits. Such materials are inorganic, nonmetallic, and typically crystalline, including, but not limited to, for example, alumina, $Al_2O_3$, beryllia, and/or other materials of various percentage purity. It is also understood that various other non-ceramic materials may also be used to fabricate member 11. Non-limiting examples of such materials include sapphire, quartz ($SiO_2$), glass and/or other insulator materials capable of withstanding high temperatures that may also vary over a relatively wide range, while providing sufficient chemical, mechanical (e.g. strength, hardness) and thermal durability associated with the package application. In addition, the material characteristics of the insulator material should exhibit minimum interference effects over the microwave frequencies of operation (e.g. virtually electromagnetically transparent). In the illustrated embodiment, member 11 takes the form of a ceramic cup member having a closed bottom surface 11b, which includes a substantially centralized aperture 11a. Aperture 11a accommodates pedestal 14 of the metallic base member 12. The ceramic cup member 11 has an open top peripheral flange 16, which may be coated with a metal 45 to enable a cover or other member to be disposed thereon—thereby closing the interior recess of ceramic cup member 11. While it is shown that the peripheral flange 16 is coated or otherwise has deposited thereon a metallic surface, it is also understood that such a metallic surface is not necessary, and that the ceramic cup member 11 may be fabricated without the coating on the peripheral edge of the cup member. The cup has a thickness adapted according to the particular application for maximizing sensitivity over a broad range of frequencies while maintaining strict mechanical strength requirements.

In one configuration, at least a portion of bottom surface 11b of cup member 11 is metallized, to facilitate securing the ceramic cup member 11 to a top surface 17 of base 12. In an exemplary embodiment, the metallized bottom surface 11b is secured to base top surface 17 via brazing. "Brazing", as used herein, generally refers to soldering two members together using a relatively hard solder with a high melting point. It is understood that other methods of securing the cup member to the base are contemplated, for example, via an epoxy and/or other securing mechanisms and materials.

The package design allows manual or automated assembly operation. Housing 10 is both substantially symmetrical and substantially coaxial, whereby all components depicted are symmetrical about both the X and Y axes. The symmetry as well as the particular geometrical configuration of the entire housing enables a microwave device 25 (e.g., a diode) to operate efficiently.

While the exact reason that performance is improved may not be fully understood, it is believed that ceramic cup 11 having central aperture 11a that accommodates pedestal 14 of base member 12, reduces interfering surfaces and/or results in a substantial reduction in capacitance, which would otherwise adversely affect the operation of a microwave device 25 secured to pedestal 14 surface 13.

While corners 18, 19 of ceramic cup 11 are shown as right angles with respect to the bottom surface 11b, in other configurations, corner(s) 18 and/or 19 can be rounded or otherwise shaped without adversely affecting operations.

Microwave device 25 can be connected in a circuit by having one terminal (e.g., the anode or cathode) of device 25 (e.g., a diode) connected to the conductive surface of the flange 16 by way of an electrical lead/connector (not shown) such as a wire/ribbon formed of an appropriate conductive material (e.g. gold, aluminum), as is known in the art. The other terminal of device 25 is connected to the pedestal 14 of base 12 (typically via eutectic methods, adhesives or via thermal compression). Once the housing or package is sealed, electrical connection is made to the cap which is electrically coupled to flange 16. Of course other terminals can be accommodated, to enable one to apply a proper operating voltage to the microwave device 25, for example.

Figure 2:
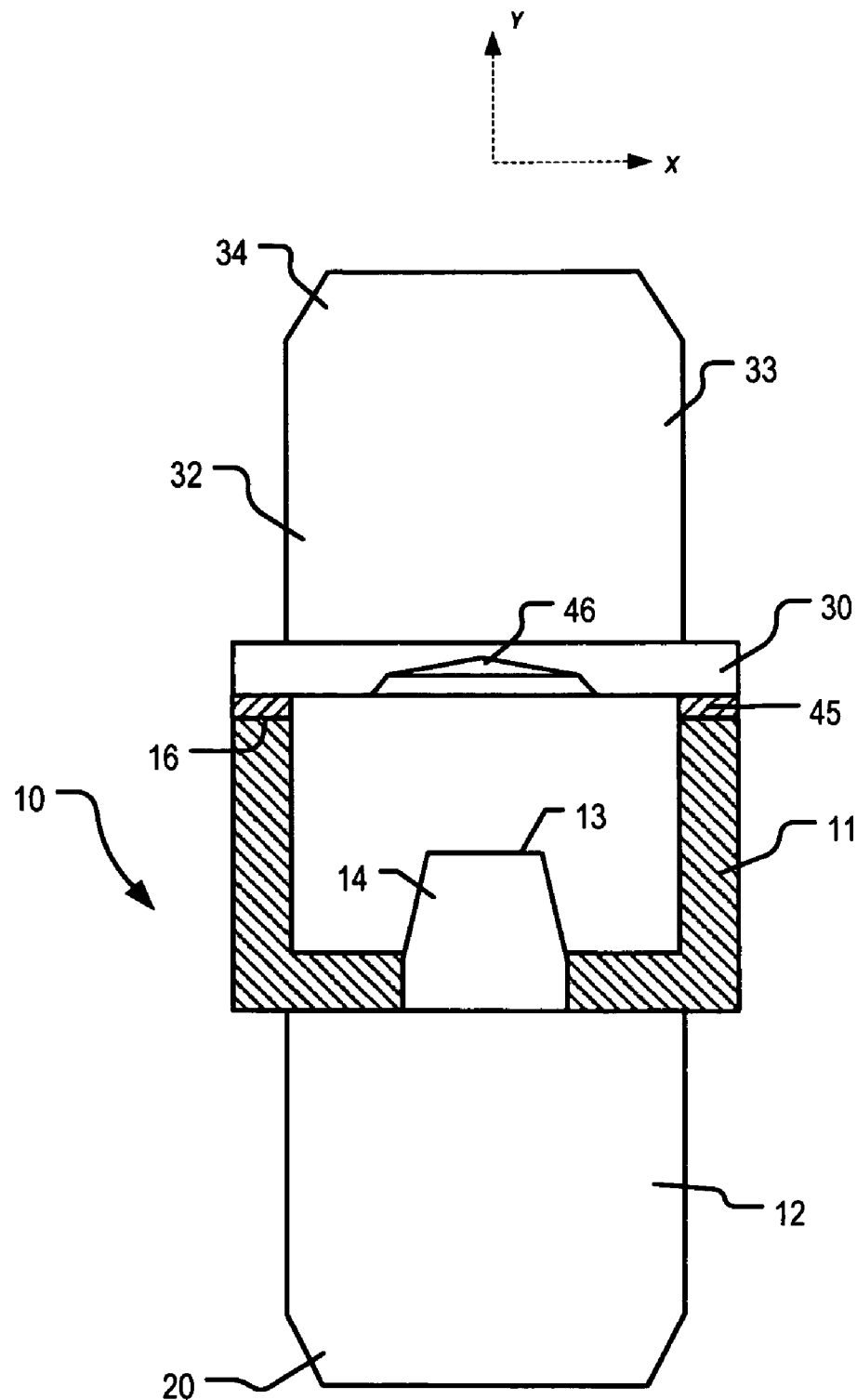
FIG. 2 is a cross-sectional view similar to FIG. 1B and showing a cover member in conjunction with the housing of FIG. 1.

Referring now to FIG. 2, there is shown the symmetrical coaxial housing 10 of FIGS. 1A and 1B, with a cover member 32 in place thereon. Cover member 32 may be metallic in nature, and composed of the same material as base member 12, for example. Cover member 32 has a bottom portion 30, which is coaxial with a cylindrical portion 33. A top portion 34 of the cover member 32 is also of a trapezoidal configuration. Portions 33 and 34 of cover member 32 may thus be seen to correspond to portions 20, 21 of base member 12. Bottom portion 30 of cover member 32 is basically a flange which exists about the periphery of cover member 32, and may be secured to flange 16 and/or metallization 45 using conventional methodologies, e.g., brazing, soldering, epoxying. Dimple cap 46 operates to improve the aspect ratio of the device.

One can ascertain from the above noted description that the entire housing is substantially symmetrical and coaxial. Housing 10 includes a base member 12 fabricated from a highly conductive metal, such as Kovar or copper or alloys thereof. The base member has an extending tapered pedestal 14, having a flat top surface 13 to accommodate a microwave device 25 (FIG. 1), such as a microwave diode or other circuit. The circuit can be connected by utilizing the conductive peripheral flange 16, 45 as one contact, or the cover member 32 as a contact, together with the base member 12 as another contact. Ceramic cup member 11 is interposed between members 12, 32 and laterally surrounds surface 13. Ceramic cup member 11 has a central aperture 11a which accommodates the tapered pedestal 14, such that the tapered pedestal protrudes through the aperture. In one configuration, the bonding of the ceramic to the metal is accomplished by high temperature bonding.

As is well known, one can bond ceramic to metal by utilizing a high temperature bonding technique. The entire cup 11 may be placed in such a high temperature oven, for example. The cover member may be secured to the ceramic member after the microwave device is in place or positioned on surface 13 of pedestal 14. The cover member may be bonded to the ceramic cup member, utilizing the metal coating on the top outer flange of the cup member or by other techniques. The pedestal diameter may be optimized to reduce orientation variations in the microwave circuit and to further reduce random chip placement during assembly operations. The height of the pedestal may be altered to "tune" the package for optimum performance at specified frequencies. Application of the cup member configuration in conjunction with the dimpled cover member further enhances performance of the package and improves the aspect ratio of the assembly. The dimple cover also provides a solder reservoir during the sealing process to prevent solder from flowing down the ribbons/wires which can cause performance problems and/or shorted devices.

The symmetrical coaxial configuration enables an improved operation of a microwave device 25 (FIG. 2) within an internal cavity defined by cup 12 and cover 32, and enables such a device to produce greater sensitivity than prior art devices contained in prior art housings. It is understood that while the above-described embodiments utilize a ceramic cup member having a cylindrical shape, other geometries are contemplated including, for example, rectangular, trapezoidal and/or other geometrics. Furthermore, while the present embodiments describe metal members and a ceramic cup, other materials may be available for fabricating the members 12, 32 and/or cup member 11, as described herein.

Figure 3:
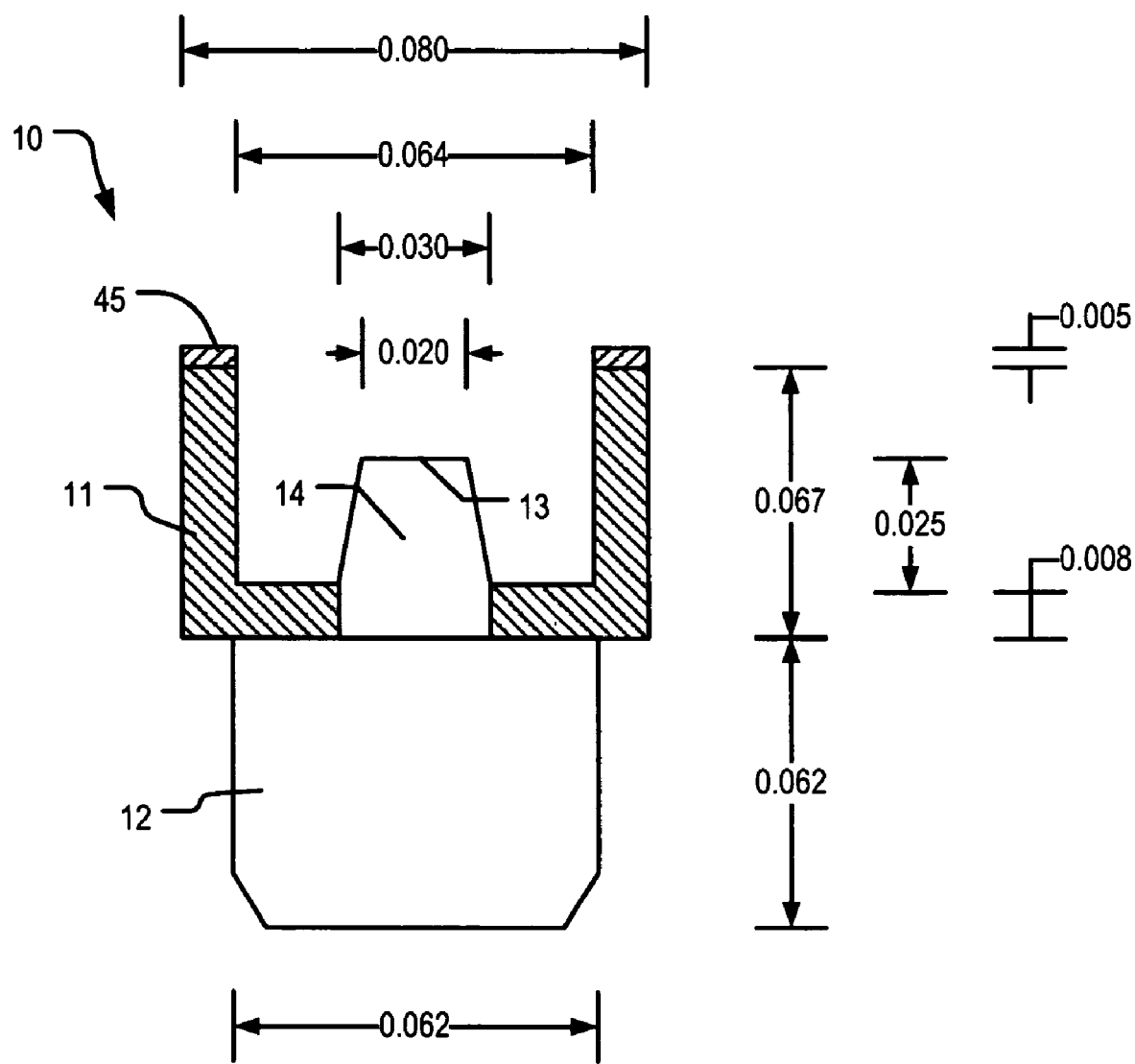
FIG. 3 is a cross-sectional view similar to FIG. 1B and showing non-limiting exemplary dimensions; and, FIGS. 4A and 4B show a prior art housing structure.
Figure 4A:
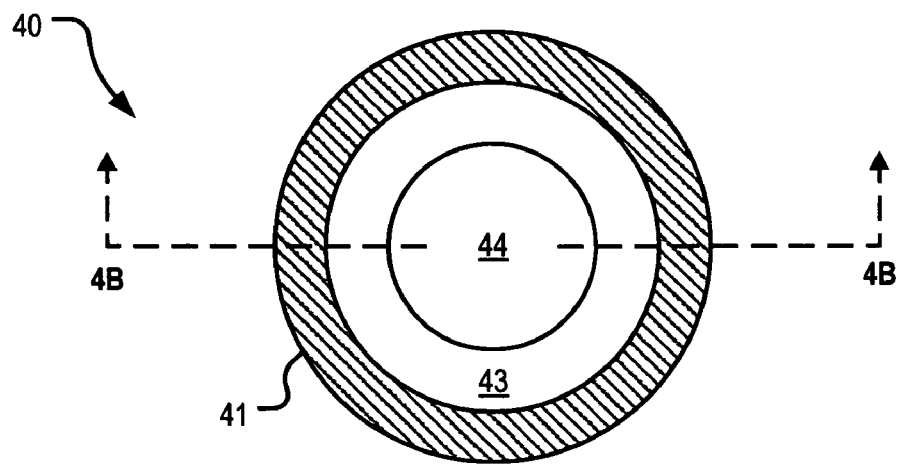
Figure 4B:
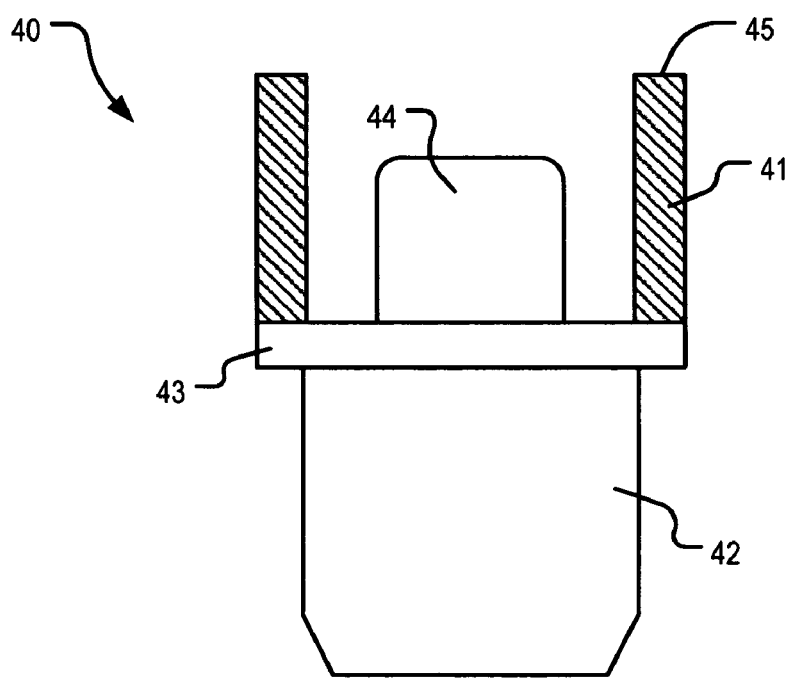

Referring now also to FIG. 3, there is shown exemplary dimensions of a housing or package according to one embodiment of the present invention. In the exemplary embodiment, the total height of the ceramic cup is around 0.067 inches with the thickness of the cup being around 0.08 inches. The inner diameter of the cup is around 0.064 inches, while the outer diameter of the cup is thus around 0.080 inches. The major diameter of the base member 12 is around 0.062 inches, with the height of the base member 12 from the bottom to the base surface 17 being around 0.062 inches as well. Pedestal 14 extends around 0.025 inches into an interior cavity formed by the cup 11. In this manner one can ascertain the ceramic cup is extremely thin, while the entire package is extremely small based on the above-noted dimensions. The top surface, for example, of the pedestal is around 0.020 inches in diameter, with the bottom of the pedestal being around 0.030 inches in diameter. The pedestal, as indicated, tapers to the top surface 13, which top surface 13 accommodates the microwave device or diodes 25 (FIG. 1B). Metallization 45 is around 0.005 inches thick.

Thus, housing 10 is small, symmetric and coaxial. It is believed that the tapered pedestal in conjunction with the ceramic cup enables a microwave device 25 (FIG. 1B) to exhibit enhanced operation in various environments. Note that while the pedestal described in conjunction with the drawings illustrates a tapered pedestal it is understood that the present invention may be embodied within a non-tapered pedestal configured within the ceramic cup. It is further understood that the detailed dimensions provided herein are exemplary of one particular embodiment, and that various other dimensions and sizes may be accommodated according to the particular application.

Those of ordinary skill in the art may recognize that many modifications and variations of the present invention may be implemented without departing from the spirit or scope of the invention. Thus, it is intended that the present invention covers the modifications and variations of this invention.

What is claimed is:

1. A housing for accommodating a microwave device, comprising:
   a metallic base member having a lower portion, and having a top and bottom surface, a central pedestal member extending from the top surface, said pedestal member having a device top surface for accommodating said microwave device;
   an insulator cup member having an open top, side walls, and a bottom surface, the bottom surface extending from the side walls, and having a pedestal accommodating aperture in said bottom surface, said pedestal accommodating aperture having a width less than the width between said side walls, with said cup member being of a greater height than the height of said pedestal member, to cause said cup to laterally surround said pedestal when said pedestal is inserted through said aperture.

2. The housing of claim 1, wherein said insulator cup member comprises a ceramic cup member.

3. The housing of claim 1, wherein said open top surface of said cup member has a metallic layer deposited above a peripheral edge thereof.

4. The housing of claim 1, further comprising a cover member secured to a peripheral edge of said open top to enclose said microwave device when accommodated on said pedestal top.

5. The housing of claim 1, wherein said pedestal includes a substantially cylindrical first portion and a tapered second portion.

6. The housing of claim 1, wherein said base member is fabricated from copper.

7. The housing of claim 1, wherein said base member comprises a nickel-cobalt ferrous alloy.

8. The housing of claim 2, wherein said ceramic cup member is fabricated from at least one of alumina ceramic and beryllium oxide.

9. The housing of claim 2, wherein said base member is secured to said ceramic cup member by a ceramic to metal seal.

10. The housing of claim 1, wherein the bottom surface of said base member has a peripheral flange.

11. The housing of claim 1, wherein said cup member, said base member and said pedestal are all coaxial.

12. The housing of claim 1, wherein said bottom surface of said cup member has a metallic layer deposited thereon, and said metallic layer is suitable for coupling to the top surface of said base member.

13. The housing of claim 1, wherein said metallic base member lower portion is substantially cylindrical.

14. The housing of claim 1, wherein said cup member comprises one of a sapphire and quartz material.

15. An electronics package comprising:
   a hollow elongated member having a closed end, side walls, and an oppositely disposed open end, the closed end extending from the side walls, and forming an interior recess, wherein said closed end terminates in a substantially central aperture whose width is less than the width between said side walls;
   a tapered support extending through said aperture and into said recess;
   at least one electronic component secured to said support within said recess; and,
   a closing member secured over said open end of said elongated member.

16. The package of claim 15, wherein said elongated member comprises a ceramic cup.

17. The package of claim 15, further comprising a metallic base member external to said recess securing said pedestal to said elongated member.

18. The package of claim 17, wherein said closing member is substantially the same size and shape as said base member.

19. The package of claim 15, wherein said tapered support provides at least one electrical contact for said at least one electronic component.

20. The package of claim 19, further comprising a metallic coating on a periphery of said open end, wherein said metallic coating provides at least a second electrical contact for said at least one electronic component.

21. The package of claim 15, wherein said at least one electronics component is selected from the group consisting of: a Gunn device, an avalanche diodes, a Schottky diode and an amplifier.

22. The package of claim 15, wherein said at least one electronics component is a microwave device.

* * * * *